United States Patent [19]

Fischer et al.

[11] 3,719,917

[45] March 6, 1973

[54] CLAMPING DEVICE FOR PRINTED CIRCUITS

[75] Inventors: Christopher L. Fischer, Sunnyvale; Richard F. Otte, Los Altos, both of Calif.

[73] Assignee: Raychem Corporation, Menlo Park, Calif.

[22] Filed: Feb. 25, 1971

[21] Appl. No.: 118,894

[52] U.S. Cl.........339/17 CF, 339/125 R, 339/128 R, 339/174

[51] Int. Cl........H01r 13/42, H01r 13/54, H05k 1/12

[58] Field of Search...........339/17 C, 17 CF, 75 MP, 176 MP, 339/99 R, 119 R, 125 R, 126 R, 128 R, 174

[56] References Cited

UNITED STATES PATENTS

| | | | |
|---|---|---|---|
| 3,335,327 | 8/1967 | Damon et al. | 339/17 CF X |
| 3,407,925 | 10/1968 | Ruehlemann | 339/17 CF X |
| 3,475,657 | 10/1969 | Knowles | 339/17 C X |
| 3,354,394 | 11/1967 | James | 339/17 CF X |
| 3,366,914 | 1/1968 | McManus et al. | 339/17 C |
| 3,391,383 | 7/1968 | Antes | 339/17 CF X |
| 3,391,382 | 7/1968 | Leibovitz | 339/17 CF X |
| 3,297,974 | 1/1967 | Pittman | 339/17 CF |
| 3,184,699 | 5/1965 | Spera | 339/17 CF |
| 3,500,288 | 3/1970 | Startin et al. | 339/128 X |

*Primary Examiner*—Marvin A. Champion
*Assistant Examiner*—Terrell P. Lewis
*Attorney*—Lyon & Lyon

[57] ABSTRACT

Described herein are clamping devices for releasably securing lead-bearing integrated circuit modules to printed circuit boards. The devices of the invention are characterized by oppositely disposed pluralities of resilient legs pendent from a body portion provided with circuit board latching means. The plural legs of the device individually engage the individual leads of the module and, acting against the said latching means, urge the module leads into electrical contact with conductors carried by the board.

7 Claims, 6 Drawing Figures

INVENTORS.
CHRISTOPHER L. FISCHER
RICHARD F. OTTE

BY Lyon & Lyon
ATTORNEYS.

INVENTORS.
CHRISTOPHER L. FISCHER
RICHARD F. OTTE
BY
Lyon & Lyon
ATTORNEYS.

CLAMPING DEVICE FOR PRINTED CIRCUITS

FIELD OF THE INVENtION

This invention relates to clamping means for releasably securing integrated circuit modules to printed circuit boards.

BACkGROUND OF THE INVENTION

Increasingly, integrated circuits are finding employment in a wide range of employments where miniaturization is desirable. Most commonly, such integrated circuits are housed in an insulative module equipped with leads from the integrated circuit itself for soldered attachment to, for example, conductors borne by printed circuit boards. In many cases, however, it would be desirable to releasably secure integrated circuit modules to circuit boards and the like. For example, replacement or testing to determine if replacement is required is facilitated if the circuit module can be returnably removed from the circuit board. Again, releasable attachment is important where it is desired to alter the function or characteristic of an electrical assembly by exchanging one integrated circuit for another. Freedom from the necessity of soldered attachment is also advantageous when it is considered that the integrated circuit may, in a particular case, be heat sensitive and therefore subject to damage during soldering operations. The employment of releasable integrated circuit clamps has been proposed before, as in Damon et al. U.S. Pat. No, 3,335,327. While such devices have proved suitable for releasable attachment, their generally solid-body structure interferes with heat dissipation from the module itself and, moreover, may lead to imprecise application of pressure to the individual leads with consequent opening of the circuit. From the foregoing, it will be apparent that a need has existed for means of releasably securing integrated circuit modules to printed circuit boards and the like without sacrificing requisite electrical continuity between the module leads and the conductors of the circuit board.

SUMMARY OF THE INVENTION

According to this invention, there is provided a clamping device for releasably securing a lead-bearing integrated circuit module to a circuit board which comprises a body portion operatively associated with resilient circuit board latching means and having oppositely disposed rows of plural resilient legs dependent from the body portion, the legs corresponding in number and spaced to engage the leads of the module and, acting against the latching means, urge them into contact with conductors carried by the board. The characteristic openwork of the clamping means of this invention encourages heat dissipation while the individual lead-contacting legs permit more efficient and effective employment of the pressure generated by the latching means. In a preferred embodiment of the invention, the body portion is provided with pendent gripping post which holdably receive the module so that the integrated circuit can be carried within the clamping means for shipment and testing.

One object of the invention is to provide clamping means for integrated circuits and having proved heat dissipation characteristics.

Another object of the invention is to provide clamping means for integrated circuit modules which admit of more efficient employment of pressure in urging the module leads into electrical contact with electrical conductors.

Another object of the invention is to provide a much lower cost clamping device for integrated circuit modules.

These and other objects and advantages of the invention will be apparent from the detailed description which follows and from the attached Figures, in which.

DETAILED DESCRIPTION OF THE INVENTION

Figure 1:
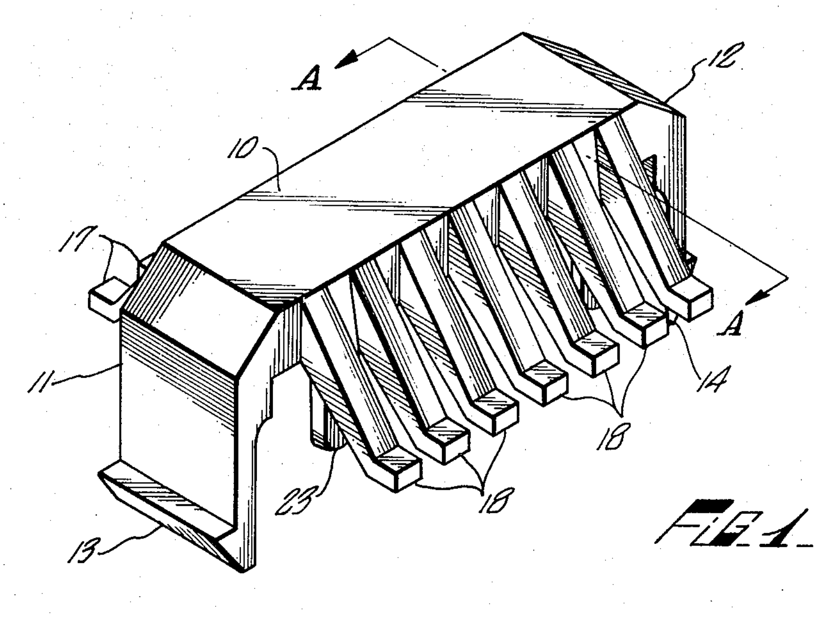
FIG. 1 is a pictorial view of one embodiment of this invention.
Figure 2:
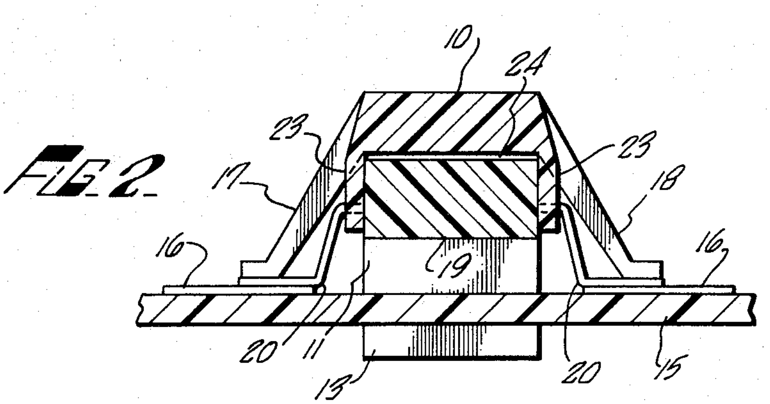
FIG. 2 is an elevation of the device shown in FIG. 1, partially sectioned along the line A—A and illustrating use of the device with an integrated circuit module and circuit board.
Figure 3:
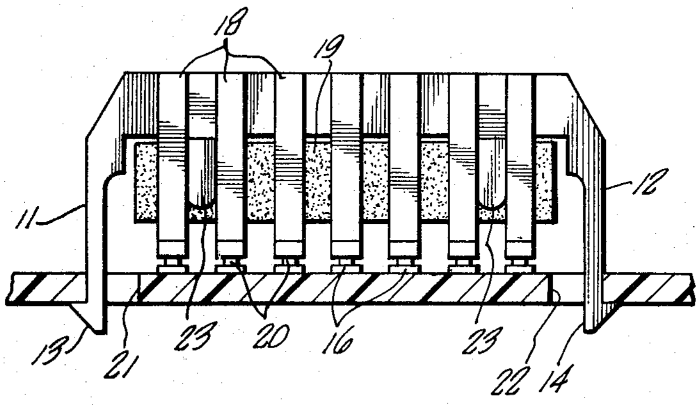
FIG. 3 is an elevation view of an embodiment of the invention depicting the manner of its employment with integrated circuit module and circuit board.

With reference now to FIGS. 1–3, a first device according to the invention has a body portion 10 from which depend circuit board latching means 11 and 12. In the depicted instance, the means 11 and 12 are respectively provided with locking lugs 13 and 14 spaced, as most clearly appears from FIG. 3, to engage the surface of circuit board 15 opposite that carrying conductors 16. Also depending from the body portion 10 are oppositely disposed rows, respectively, of plural resilient legs 17 and 18. As is clear from FIG. 3, the apertures between the resilient legs of the device permit the free passage of air around integrated circuit module 19, aiding dissipation of heat therefrom.

The rows of legs 17 and 18 angularly outwardly depend from body portion 10. With the module 20 in place and its leads aligned with legs 17 and 18, then, when latching members 11 and 12 are inserted through slots 21 and 22 in circuit board 15, legs 17 and 18 are inwardly resiliently flexed to pressurize the lead-contact pairs with which they are respectively associated. In other words, the legs react to the upward force exerted upon board 15 by latching members 13 and 14 by downwardly pressurizing the lead-contact pairs. Since this downward force is exerted only upon the lead-contact pairs, fine control of pressure is had since no downward force is passed directly to board 15. Accordingly, less upward force must needs be generated by latching members 13 and 14 so that the danger of mutilating or buckling board 15 is lessened. Inasmuch as legs 17 and 18 are, by reason of their elongate configuration, endowed with individual "play," clamping means according to this invention can be cheaply manufactured by techniques like injection molding and stamping not generally given to the attainment of close tolerances. On the other hand, were a plurality of leads to be contacted by a single, monolithic pressurizing member, especial care might be required to ensure against open circuits consequent upon dimensional variance in the clamping means itself.

Preferably, lugs 13 and 14 are oppositely faced so that, once module 19 is in place, the clamping device can be inserted through circuit board slots 21 and 22 simply by depressing means 11 and 12 between thumb and forefinger. Preferably, slots 21 and 22 are somewhat wider than is required to admit lugs 13 and 14, so as to permit sidewise manipulation of the clamping device to obtain wiping action and ensure that good electrical contact is made. This feature is also useful in testing, since if one suspects that a contact is open, that suspicion can be checked simply by sliding the clamping device back and forth and observing whether the contact closes.

In a preferred embodiment, there depend from body portion 10 an oppositely disposed plurality of gripping posts 23 spaced to receive and firmly engage the body of module 19 in nesting relation. Gripping posts 23 preferably exert pressure only upon the sidewalls of module 19. As most clearly appears in FIG. 2, the clamping device is sized to nest module 19 between gripping posts 23 while preferably maintaining free space 24 above module 19. That space aids in heat dissipation and ensures that optimal pressure will be exerted upon leads 20 rather than upon the module housing. It will be appreciated that, by the provision of gripping posts 23, module 19 can be firmly and snugly nested within the depicted clamp for shipping and testing purposes.

Figure 4:
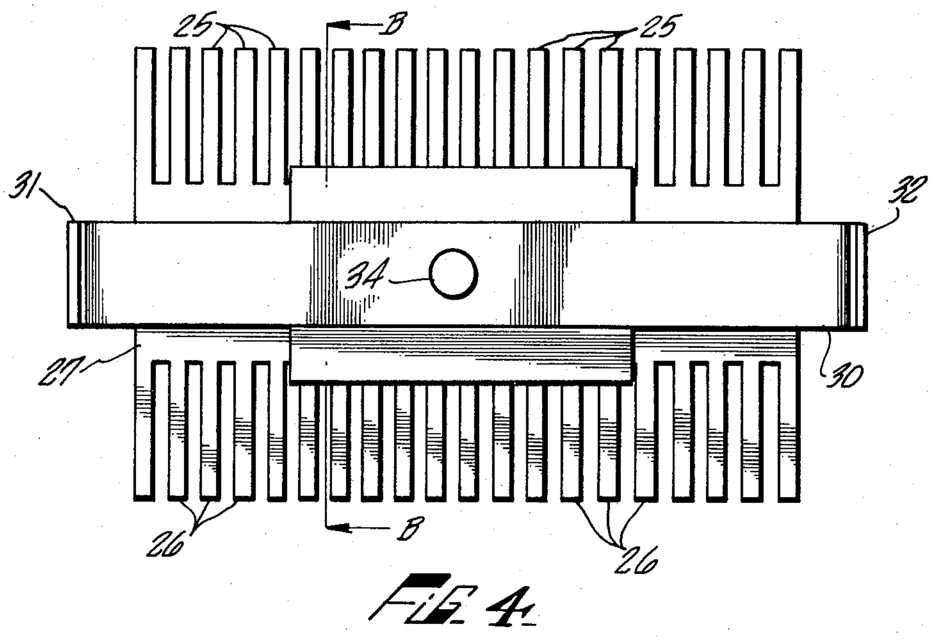
FIG. 4 is a plane view of a second embodiment of the invention.
Figure 5:
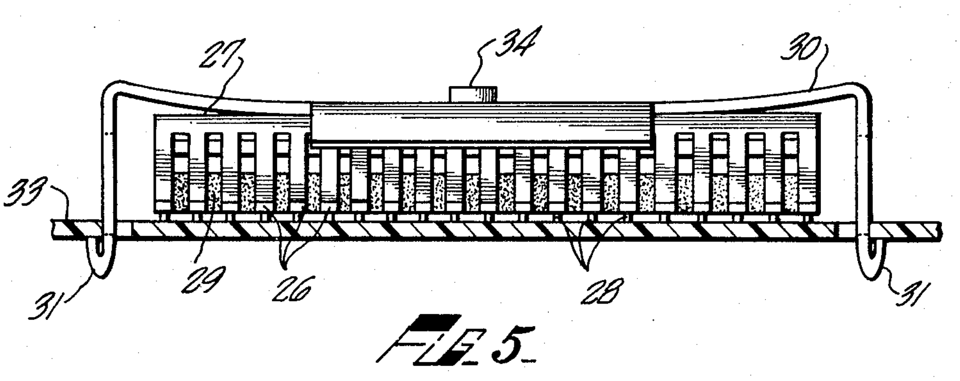
FIG. 5 is an elevation view of the embodiment of FIG. 4 depicting its employment with a "flat pack" integrated circuit module.
Figure 6:
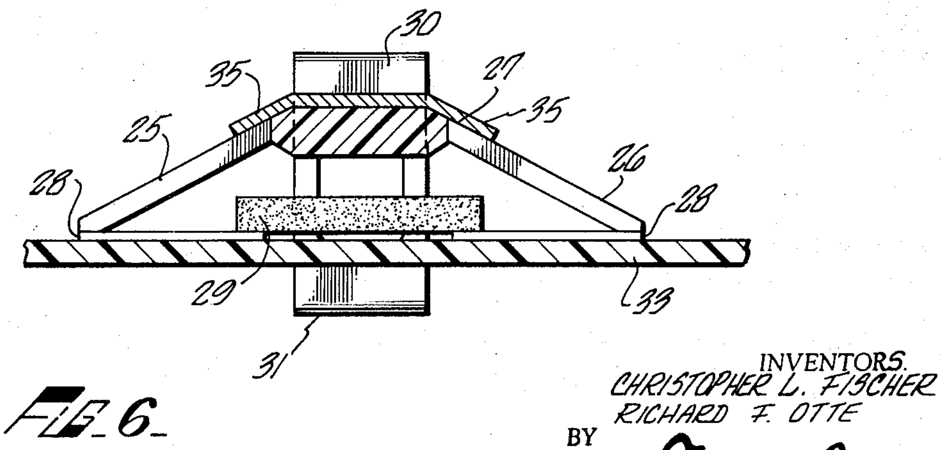
FIG. 6 is an elevation view of the device of FIG. 4, partially sectioned along the line B—B and depicting its employment with an integrated circuit module and circuit board.

A second embodiment of the invention is depicted in FIGS. 4–6. Here, legs 25 and 26 depend from body portion 27 to pressurize the leads 28 of integrated circuit module 29. Associated with body portion 27 is elongate spring member 30 whose opposite ends 31 and 32 are adapted to engage the surface of board 33 opposite that contacted by leads 28. The mid-portion of spring member 30 acts upon and preferably is affixed to body portion 27. For example, integrally formed on body portion 27 may be thermoplastic protrusion 34 which can be passed through an opening in spring member 30 and employed to heat-stake member 30 to body portion 27. Alternatively, an opening in member 30 could simply be sized to be force fit over protrusion 34, a metal spring member 30 could be spot-welded to a metal body portion 27, etc. Spring member 30 is preferably provided with wings 35 to prevent undue sidewise slippage of body portion 10 where the same is not attached to spring member 30, rotation of body portion 27 about a single point of attachment, etc.

In general, the operation of the device shown in FIGS. 4–6 is similar to that shown in FIGS. 1–3, save that the former embodiment is preferred where modules having greater than about 16 leads are to be attached. An important advantage of the embodiment shown in FIGS. 4–6 as compared to that shown in FIGS. 1–3 is that the former device can be employed with circuit boards varying in thickness whereas in the latter case the suitable board thickness is more or less set by the spacing of locking lugs 13 and 14.

It will be apparent from the foregoing that the clamping means of the invention can be provided with any number of legs depending upon the module contemplated for attachment. Generally, the clamping means will have from about four to about 50 or more legs. Preferably, the device of FIGS. 1–3 is employed with modules having from about 12 to about 16 leads, while the device shown in FIGS. 4–6 is recommended for use with modules having 16 or more leads.

Devices like that shown in FIG. 1 and the body and leg portions of that shown in FIG. 4 can be integrally formed, as by injection molding of a suitably resilient plastic, e.g., polyethylene, polypropylene, nylon, etc. Preferably, materials employed are creep-resistant. Polycarbonates like those sold under the trade name "Lexan" are suitable to this end, which can also be achieved by stamp-forming the device from a suitable metal, e.g., beryllium-copper. Of course, where metal is employed as the base material, the surfaces thereof are provided with a polyimide or other suitable insulative coating to avoid shorting across the plural legs thereof.

From the foregoing, it will be apparent that there has been provided by the invention economic and facile means of releasably securing integrated circuit modules to circuit boards and the like while ensuring efficient and precise application of pressure to maintain electrical contact.

We claim:

1. A clamping device for releasably securing a lead-bearing integrated circuit module to a circuit board which comprises a body portion, resilient circuit board latching means operatively associated with said body portion, and pluralities of independent legs extending from said body portion on opposite sides thereof and angularly outwardly therefrom, said legs corresponding in number and spaced to engage the leads of such module and, acting against said latching means, to urge them into contact with conductors carried by a circuit board.

2. The device of claim 1 wherein said latching means are comprised of a pair of oppositely disposed ears depending from said body portion and provided with locking lugs spaced to engage the surface of a circuit board opposite that carrying said conductors.

3. The device of claim 1 which additionally comprises an oppositely disposed plurality of gripping posts depending from said body portion and spaced to receive and firmly engage the body of such module in nesting relation.

4. The device of claim 1 wherein said latching means are comprised of an elongate spring member whose mid-portion is attached to said body portion and whose opposite ends are adapted to engage the surface of a circuit board opposite that carrying said conductors.

5. A device according to claim 2 having from about six to about eight of said legs extending on each side of said body portion.

6. A device according to claim 4 having from about eight to about 25 of said legs extending on each side of said body portion.

7. In combination, the device of claim 3 having an integrated circuit module firmly held in nesting relation between said gripping posts.

* * * * *